United States Patent [19]

Maine

[11] Patent Number: 4,532,637
[45] Date of Patent: Jul. 30, 1985

[54] DIFFERENTIAL RECEIVER

[75] Inventor: Reuben E. Maine, Charlottesville, Va.

[73] Assignee: Sperry Corporation, New York, N.Y.

[21] Appl. No.: 455,432

[22] Filed: Jan. 3, 1983

[51] Int. Cl.$^3$ .............................................. G01S 5/08
[52] U.S. Cl. .................................... 375/10; 343/394; 324/83 FE
[58] Field of Search ......... 343/394; 324/83 R, 83 FE; 455/132, 136, 137, 139, 141; 375/1, 84, 10

[56] References Cited

U.S. PATENT DOCUMENTS

| | | | |
|---|---|---|---|
| 2,951,152 | 8/1960 | Sichak et al. | 455/139 |
| 3,540,055 | 11/1970 | Takagi | 455/141 |
| 4,071,821 | 1/1978 | Harthill et al. | 324/83 R |

Primary Examiner—Benedict V. Safourek
Attorney, Agent, or Firm—Howard P. Terry; Seymour Levine

[57] ABSTRACT

A phase differential determining apparatus generates low frequency output signals from a multiple channel receiver and extracts relative phase angles of the received RF signals therefrom. The same local oscillator signals, which are phase locked to one of the received RF signals, are utilized for all channels thus preserving the phase difference of the RF signals during the heterodyning process so that phase angle differences between the low frequency output signals is the same as the phase angle differences between the received RF signals. The relative phase angles are determined at the low frequency output level by phase shifting a low frequency signals from the local oscillator that is phase locked to a reference channel and varying the phase shift applied thereto until the phase difference between this low frequency local oscillator signal and the low frequency output signal of the selected channel is zero. The phase shift introduced to the low frequency local oscillator signal is equal to the difference in phase between the two RF signals.

12 Claims, 1 Drawing Figure

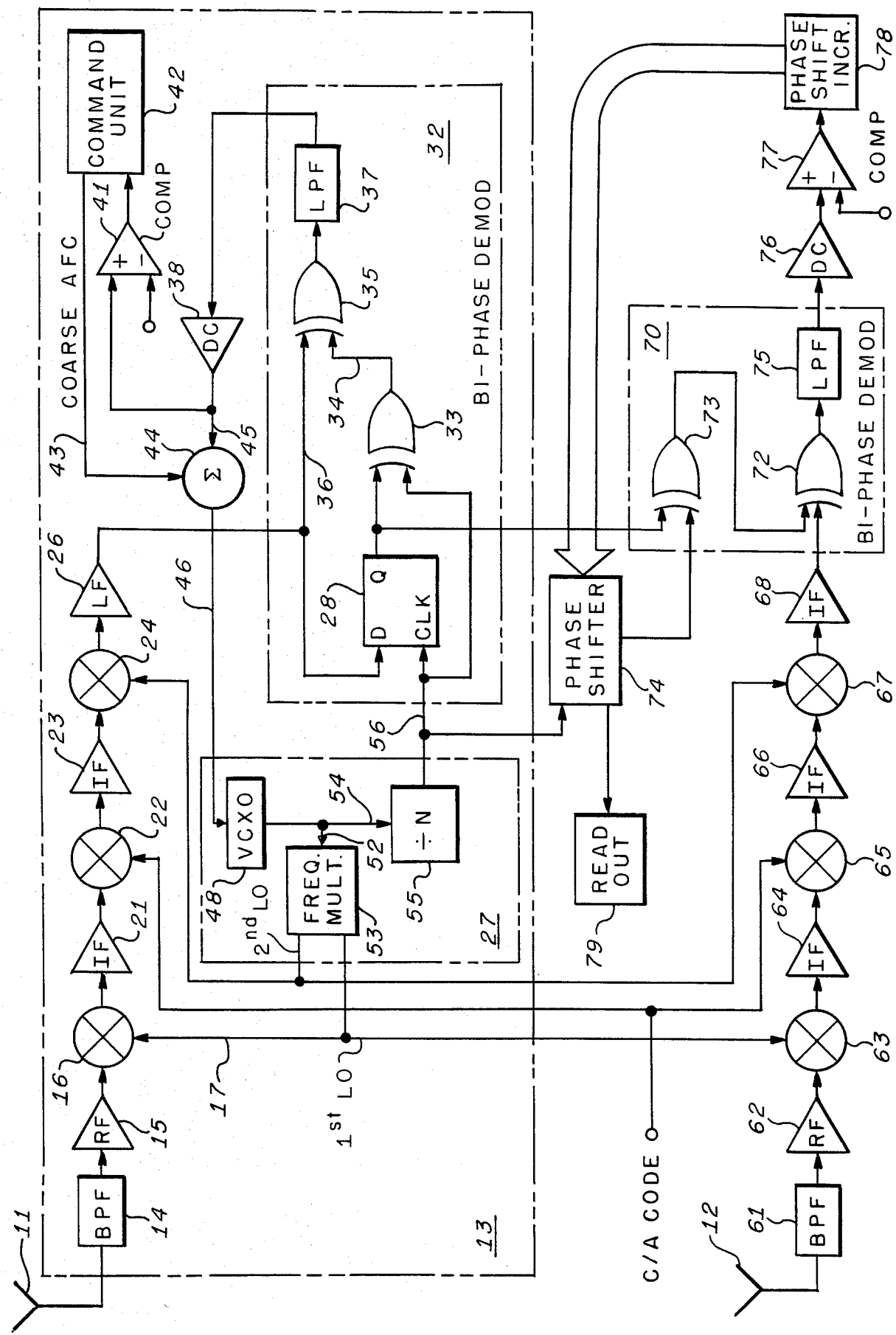

DIFFERENTIAL RECEIVER

BACKGROUND OF THE INVENTION

1. Field of the Invention

The invention relates generally to relative phase measurements and more specifically to receivers for determining phase differentials of RF signals.

2. Description of the Prior Art

Various electronic navigation systems are well known in the art. Loran systems, for instance, have found wide acceptance and are proved to be a valuable aid to navigation. More recently, a Global Positioning System (GPS) has been proposed wherein a constellation of satellites will be positioned in orbit around the Earth. Each satellite transmits data by via signals operating at two frequencies which are modulated by dual psuedorandum noise codes in clear/acquisition (CA) and precision (P) codes peculiar to that satellite. The modulation is structured to establish a spread spectrum transmission that can be identified and processed by the user to determine his position. Receivers for utilization and such systems are described, for instance, in U.S. Pat. No. 4,457,006 issued to Reuben E. Maine on June 26, 1984 entitled "Global Positioning System Receiver" and in U.S. Pat. No. 4,453,165 issued to Reuben E. Maine on June 5, 1984 entitled "Differential Doppler Receiver" both patents being assigned to the assignee of the instant invention.

The receiver disclosed in the former U.S. Application utilizes a phase lock loop to derive local oscillators for a double heterodyne receiver which converts IF signals from the earth's orbital satellite to audio frequency output signals. Since both local oscillators are locked to a common reference oscillator, the phase variation of the audio signal contains all the information impressed on the RF signals. In the latter U.S. application, the receiver deisclosed retains the advantages of prior GPS receivers and additionally accurately measures the Doppler frequency of RF signals from a transmitter moving with respect to the receiver by using a second transmitter having a stable and precisely known frequency as the reference. Signals from the two sources are processed in a differential mode to eliminate the need for a precise timing clock in the receiver.

The receiver of the present invention generates low frequency output signals from which the relative phase angles of an RF carrier signal received at separated antennas may be extracted.

SUMMARY OF THE INVENTION

The present invention relates to a receiver which determines the phase difference between signals indicent from a common source to antennas that are positioned at separated locations. The signals collected by each antenna are respectively coupled to heterodyning circuits, each of which may be of the double heterodyne type, for conversion to low frequency output signals. Included in each heterodyning circuit is circuitry for selecting a desired coded signal, from a plurality of coded signals, with the aid of a selection signal coupled thereto. A local oscillator, phase locked to one low frequency output signal and consequently to one of the RF signals, provides the local oscillator signals required for the heterodyning process. A signal representative of the phase locked local oscillator signals is phase shifted and coupled to a phase comparator with a low frequency output signal from a second heterodyning circuit, wherefrom a signal is provided that is representative of the phase difference between the phase shifted local oscillator representative signal and the low frequency output signal from the second heterodyning circuit. This phase representative signal is utilized to provide a control signal to vary the phase value of the phase shifter until the low frequency output signal from the second heterodyning circuit and the phase shifted local oscillator representative signals are in phase. The value of the phase shifter when the two signals are in phase is representative of the phase difference between the incident signals at the two antenna locations.

BRIEF DESCRIPTION OF THE DRAWINGS

The single FIGURE is a schematic diagram of a preferred embodiment of the invention.

DESCRIPTION OF THE PREFERRED EMBODIMENTS

A plane wave signal instant to separated antennas 11 and 12 induces signals thereat that vary in phase in accordance with the angle of incidence and the separation of the antennas. In accordance with the invention, the signal from antenna 11 is coupled to a receiver 13, which may be of the type fully described in the aforementioned U.S. Pat. No. 4,457,006. Briefly, the signal from antenna 11 is coupled through a bandpass filter 14 and an RF amplifier 15 to a mixer 16 through which a first local oscillator frequency is also coupled via line 17. The difference frequency signal from the mixer is amplified by wideband IF amplifier 21 and coupled to a modulator 22 wherein it is biphase modulated by a signal representative of the C/A code applied to the transmitted signals from the satellite. When the locally generated C/A code is in time synchronization with the transmitted code the effect of the transmitted code modulation is cancelled and the bandwidth of the signal is returned from the wide spread spectrum bandwidth to the original narrow bandwidth occupied by the satellite data stream. The selected C/A coded signal is coupled from modulator 22 through a narrowband IF amplifier 23 wherefrom it is coupled along with a second local oscillator signal via line 25 to a second mixer 24 wherefrom a low frequency signal, which may be in the order of 1 KHz, is coupled to a low frequency amplifier 26.

The low frequency signal from the low frequency amplifier 26 and a signal from local oscillator (LO) 27, representative of the local oscillator frequencies are respectively coupled to the "D" and clock terminals of a "D" type flip-flop 28 which is included in biphase demodulator 32, which may be of the type described in U.S. Pat. No. 4,344,041 entitled "Biphase Detector", issued to Reuben E. Maine on Aug. 10, 1982 and assigned to the assignee of the present invention. Flip-flop 28 functions as a phase detector, detecting the polarity of the low frequency signal when clocked by the LO representative signal. The signal at the clock terminal is additionally coupled to an exclusive OR gate 33, to which the "Q" output of flip-flop 28 is also coupled. Exclusive OR gate 33 operates to invert the clock pulse when the low frequency signal from amplifier 26 lags the clock signal and maintains the clock phase when the low frequency signal leads the clock signal. Output signals from OR gate 33 are coupled via line 34 to one input terminal of a second exclusive OR gate 35, having a second input terminal coupled, via line 36, to the output terminal of the low frequency amplifier 26. Signals at the output terminals of OR gate 35 are coupled via a lowpass filter (LPF)37 to a d.c. amplifier 38, wherefrom signals representative of the phase difference between the clock signal to flip-flop 28 and the low frequency signal from amplifier 26 are coupled to a signal from the comparator circuit 41, the output terminal of which may be coupled to a frequency increment command unit 42. After each system clock pulse for which the filtered and amplified signal at the output terminal of exclusive OR gate 35 exceeds a threshold signal coupled to the comparator 41, the frequency increment command unit 42 provides a signal via line 43, that is representative of a coarse frequency increment of the local oscillator 27, to a sum circuit 44. The signal at the output terminal of amplifier 38, representative of a fine frequency adjustment, is also coupled, via line 45, to the sum circuit 44. The sum of the signals coupled to the sum circuit 44 is coupled via line 46 to a voltage controlled crystal oscillator 48 which is the basic unit of the local oscillator 27. Signals from the voltage controlled crystal oscillator 48 are coupled via line 52 to a frequency multiplier 53, wherefrom the previously mentioned first and second local oscillator frequencies are respectively coupled to the mixers 16 and 17. The output signal of the voltage controlled crystal oscillator 48 is also coupled via line 54 to divide by N circuit 55, wherefrom a signal at a frequency that is 1/N times the frequency of the signal at the output terminals of the voltage controlled crystal oscillator 48 is coupled via line 56 to the clock terminal of flip-flop 28.

Similarly, signals received at antenna 12 are coupled via bandpass filter 61 and RF amplifier 62 to a mixer 63 to which the first local oscillator signal is also coupled. An IF signal from mixer 63 is coupled via a wideband amplifier 64 to coded signal modulator 65 wherefrom the selected signal is amplified by narrowband IF amplifier 66 and coupled to a second mixer 67 in the channel, to which the second local oscillator signal is also coupled. The low frequency signal from the second local oscillator is coupled via amplifier 68 to an input terminal of an exclusive OR gate 72 included in a second biphase demodulator 70. One input terminal of exclusive OR gate 72 is coupled to the output terminal of a second exclusive OR gate 73 in biphase demodulator 70. Exclusive OR gate 73 has a first input terminal coupled via phase shifter 74 to the output terminal of the divide by N circuit 55 and a second input terminal coupled to the "Q" terminal of the flip-flop 28 in the biphase demodulator 32.

When the clock signal to flip-flop 28 leads the signal at the "D" input terminal thereof, and the signal at the "Q" terminal is high, OR gate 73 inverts the phase shifted clock signal prior to coupling to the second input terminal of exclusive OR gate 72, while a noninverted signal is coupled when the clock signal lags the signal at the "D" terminal. Thus, the biphase demodulator 70 is slaved to the biphase demodulator 32. Exclusive OR gate 72 provides a phase comparison between the signal at the output terminal of exclusive OR gate 73 and the low frequency signal coupled from amplifier 68, which is of a phase substantially equal to phase of the received signal at antenna 12. The signal at the output terminals of exclusive OR gate 72 is coupled via lowpass filter 75 and a d.c. amplifier 76 to an amplitude comparator 77, wherefrom a signal is coupled to a phase shift incrementing signal generator 78 whenever the signal from d.c. amplifier 76 exceeds a threshold signal coupled to comparator 77. For each system clock pulse, during which a signal is coupled to the incrementing phase shift signal generator 78, a signal to increment the phase shift, by a predetermined differential phase angle, is coupled to a phase shifter 74. This process continues until the signal from the d.c. amplifier 76 does not exceed the threshold signal coupled to comparator 77. At this time, the total phase angle of the phase shifter 74 as read out of "read out device" 79 is substantially the phase difference between the signal at antenna 11 and the signal at antenna 12.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. An apparatus for determining phase differentials between a plurality of received signals comprising:
   first and second means for receiving signals at a first frequency;
   local oscillator means for providing a plurality of local oscillator signals;
   first and second heterodyning means coupled to receive said plurality of local oscillator signals and respectively to said first and second receiving means for down converting said signals at said first frequency signals at a second frequency;
   first phase comparator means coupled to receive said signals at said second frequency from said first heterodyning means and signals representative of said local oscillator signals for providing signals to said local oscillator means representative of phase differences between said local oscillator signals and said signals at said second frequency of said first heterodyning means;
   means coupled to said local oscillator means for imparting phase shifts to said local oscillator representative signals, thereby providing phase shifted representative signals;
   second phase comparator means slaved to said first phase comparator means, coupled to receive said phase shifted representative signals and said signal at said second frequency from said second heterodyning means for providing signals representative of phase differences therebetween;
   means coupled to receive said phase difference representative signals from said second phase comparator for providing a phase shift control signal to said phase shifting means which is representative of phase differences between said phase shifted representative signal and said signal at said second frequency from said second heterodyning means, whereby said phase shifting means provides phase shifts representative of said phase differences between signals at said first and second receiving means when said signal at said second frequency from said second heterodyning means and said phase shifted representative signal are of substantially equal phases.

2. A phase differential determining apparatus in accordance with claim 1 wherein said first phase comparator means includes:
   signal transfer means having first input means coupled to receive said second signals from said first heterodyning means and second input means coupled to receive said local oscillator representative signals for providing signals at output means representative of signals at said first input means during selected signal transitions at said second input means;

first gate means having first and second input means respectively coupled to said output means and said second input means of said signal transfer means for providing high level signals at output means thereof when high level signals appear at one of said first and second input means and low level signals appear at said first and second input means other than said one and for providing low level signals at said output means when signals of similar levels are coupled to said first and second input means;

second gate means having first input means coupled to receive said second signal from said first heterodyning means and second input means coupled to said output means of said first gate means for providing high level signals at output means thereof when high level signals appear at one of said first and second input means and low level signals appear at said first and second input means other than said one and for providing low level signals at said output means when signals of similar levels are coupled to said first and second input means; and filter means having input means coupled to said output means of said second gate means and output means coupled to said local oscillator means for providing signals to control frequencies of said local oscillator means;

and said second phase comparator means includes:

first gate means having first input means coupled to said output means of said signal transfer means and second input means coupled to receive said phase shifted local oscillator representative signal for providing high level signals at output means thereof when high level signals appear at one of said first and second input means and low level signals appear at said first and second input means other than said one for providing low level signals at said output means when signals of similar levels are coupled to said first and second input means;

second gate means having first input means coupled to said output means of said first gate means of said second phase comparator means and second input means coupled to receive said second signal from said second heterodyning means for providing high level signals at output means thereof when high level signals appear at one of said first and second input means and low level signals appear at said first and second input signals other than said one and for providing low level signals at said output means when signals of similar levels are coupled to said first and second input means; and second filter means having input means coupled to said output means of said fourth gate means and output means coupled to said phase shifting means for providing said phase difference representative signals.

3. An apparatus in accordance with claim 1 wherein said first comparator means includes:

a D type flip-flop having a D terminal coupled to receive said second signal from said first heterodyning means, a clock terminal coupled to receive said local oscillator representative signal and a Q terminal;

a first exclusive OR gate having first and second input terminals respectively coupled to said Q terminal and said clock terminal of said D type flip-flop and having an output terminal; and a second exclusive OR gate having first and second input terminals respectively coupled to said D terminal of said D type flip-flop and said output terminal of said first exclusive OR gate and an output terminal coupled to said local oscillator means.

4. An apparatus in accordance with claim 3 wherein said second comparator means includes:

a phase shifter having an input terminal coupled to said clock terminal of said D type flip-flop, an output terminal, and a terminal for receiving phase shift command signals;

a third exclusive OR gate having a first input terminal coupled to said output terminal of said phase shifter, an input terminal coupled to said Q terminal of said D type flip-flop and an output terminal; and a fourth exclusive OR gate having a first input terminal coupled to said output terminal of said third exclusive OR gate, a second input terminal coupled to receive said signals at said second frequency from said second heterodyning means, and an output terminal coupled to said phase shift control signal means.

5. An apparatus in accordance with claim 1 wherein said first and second heterodyning means each include first and second mixer means coupled to said local oscillator means for receiving first and second local oscillator signals respectively thereby establishing a double conversion system for converting said first signals to said second signals.

6. A phase differential determining apparatus in accordance with claim 5 wherein said first comparator means includes:

signal transfer means having first input means coupled to receive said second signals from said first heterodyning means and second input means coupled to receive said local oscillator representative signals for providing sisgnals at output means representative of signals at said first input means during selected signal transitions at said second input means;

first gate means having first and second input means respectively coupled to said output means and said second input means of said signal transfer means for providing high level signals at output means thereof when high level signals appear at one of said first and second input means and low level signald appear at said first and second input means other than said one and for providing low level signals at said output means when signals of similar levels are coupled to said first and second input means;

second gate means having first input means coupled to receive said second signal from said first heterodyning means and second input means coupled to said output means of said first gate means for providing high level signals at output means thereof when high level signals appear at one of said first and second input means and low level signals appear at said first and second input means other than said one and for providing low level signals at said output means when signals of similar levels are coupled to said first and second input means; and filter means having input means coupled to said output means of said second gate means and output means coupled to said local oscillator means for providing signals to control frequencies of said local oscillator means;

and said second phase comparator means includes:

first gate means having first input means coupled to said output means of said signal transfer means and second input means coupled to receive said phase shifted local oscillator representative signal for providing high level signals at output means thereof when high level signal appear at one of said first and second input means and low level signals appear at said first and second input means other than said one and for providing low level signals at said output means when signals of similar levels are coupled to said first and second input means;

second gate means having first input means coupled to said output means of said first gate means of said second phase comparator means and second input means coupled to receive said second signal from said second heterodyning means for providing high level signals at output means thereof when high level signals appear at one of said first and second input means and low level signals appear at said first and second input signals other than said one and for providing low level signals at said output means when signals of similar levels are coupled to said first and second input means; and second filter means having input means coupled to said output means of said fourth gate means and output means coupled to said phase shifting means for providing said phase difference representative signals.

7. An apparatus in accordance with claim 5 wherein said first comparator means includes:

a D type flip-flop having a D terminal coupled to receive said second signal from said first heterodyning means, a clock terminal coupled to receive said local oscillator representative signal and a Q terminal;

a first exclusive OR gate having first and second input terminals respectively coupled to said Q terminal and said clock terminal of said D type flip-flop and having an output terminal; and a second exclusive OR gate having first and second input terminals respectively coupled to said D terminal of said D type flip-flop and said output terminal of said first exclusive OR gate and an output terminal coupled to said local oscillator means.

8. An apparatus in accordance with claim 7 wherein said second comparator means includes:

a phase shifter having an input terminal coupled to said clock terminal of said D type flip-flop, an output terminal, and a terminal for receiving phase shift command signals;

a third exclusive OR gate having a first input terminal coupled to said output terminal of said phase shifter, an input terminal coupled to said Q terminal of said D type flip-flop and an output terminal;

a fourth exclusive OR gate having a first input terminal coupled to said output terminal of said third exclusive OR gate, a second input terminal coupled to receive said signals at said second frequency from said second heterodyning means, and an output terminal coupled to said phase shift control signal means.

9. An apparatus for determining phase differentials between a plurality of received signals in accordance with claim 1 further including means for coupling a selection signal to said first and second heterodyning means, said selection signal for utilization to extract a selected coded signal from a plurality of modulating coded signals applied to said first signals.

10. A phase differential determining apparatus in accordance with claim 9 wherein said first phase comparator means includes:

signal transfer means having first input means coupled to receive said second signals from said first heterodyning means and second input means coupled to receive said local oscillator representative signals for providing signals at output means representative of signals at said first input means during selected signal transitions at said second input means;

first gate means having first and second input means respectively coupled to said output means and said second input means of said signal transfer means for providing high level signals at output means thereof when high level signals appear at one of said first and second input means and low level signals appear at said first and second input means other than said one and for providing low level signals at said output means when signals of similar levels are coupled to said first and second input means;

second gate means having first input means coupled to receive said second signal from said first heterodyning means and second input means coupled to said output means of said first gate means for providing high level signals at output means thereof when high level signals appear at one of said first and second input means and low level signals appear at said first and second input means other than said one and for providing low level signals at said output means when signals of similar levels are coupled to said first and second input means; and filter means having input means coupled to said output means for said second gate means and output means coupled to said local oscillator means for providing signals to control frequencies of said local oscillator means;

and said second phase comparator means includes:

first gate means having first input means coupled to said output means of said signal transfer means and second input means coupled to receive said phase shifted local oscillator representative signal for providing high level signals at output means thereof when high level signals appear at one of said first and second input means and low level signals appear at said first and second input means other than said one and for providing low level signals at said output means when signals of similar levels are coupled to said first and second input means;

second gate means having first input means coupled to said output means of said first gate means of said second phase comparator means and second input means coupled to receive said second signal from said second heterodyning means for providing high level signals at output means thereof when high level signals appear at one of said first and second input means and low level signals appear at said first and second input signals other than said one and for providing low level signals at said output means when signals of similar levels are coupled to said first and second input means; and second filter means having input means coupled to said output means of said fourth gate means and output means coupled to said phase shifting means for providing said phase difference representative signals.

11. An apparatus in accordance with claim 9 wherein said first comparator means includes:
- a D type flip-flop having a D terminal coupled to receive said second signal from said first heterodyning means, a clock terminal coupled to receive said local oscillator representative signal and a Q terminal;
- a first exclusive OR gate having first and second input terminals respectively coupled to said Q terminal and said clock terminal of said D type flip-flop and having an output terminal; and
- a second exclusive OR gate having first and second input terminals respectively coupled to said D terminal of said D type flip-flop and said output terminal of said first exclusive OR gate and an output terminal coupled to said local oscillator means.

12. An apparatus in accordance with claim 11 wherein said second comparator means includes:
- a phase shifter having an input terminal coupled to said clock terminal of said D type flip-flop, an output terminal, and a terminal for receiving phase shift command signals;
- a third exclusive OR gate having a first input terminal coupled to said output terminal of said phase shifter, an input terminal coupled to said Q terminal of said D type flip-flop and an output terminal; and
- a fourth exclusive OR gate having a first input terminal coupled to said output terminal of said third exclusive OR gate, a second input terminal coupled to receive said signals at said second frequency from said second heterodyning means, and an output terminal coupled to said phase shift control signal means.

* * * * *